United States Patent
Anker et al.

(10) Patent No.: US 6,391,679 B1
(45) Date of Patent: May 21, 2002

(54) METHOD OF PROCESSING A SINGLE SEMICONDUCTOR USING AT LEAST ONE CARRIER ELEMENT

(75) Inventors: Joachim Anker; Olaf Dichte, both of Hamburg; Frank Burmeister, Langenhagen, all of (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/434,158

(22) Filed: Nov. 4, 1999

(30) Foreign Application Priority Data

Nov. 5, 1998 (DE) .......................... 198 50 873

(51) Int. Cl.$^7$ .......................... H01L 21/44; H01L 21/48; H01L 21/50
(52) U.S. Cl. .......................... 438/106; 438/118; 438/464
(58) Field of Search .......................... 438/106, 118, 438/458, 464, 465

(56) References Cited

U.S. PATENT DOCUMENTS

| | | |
|---|---|---|
| 3,783,499 A | 1/1974 | Hughes et al. ................ 29/574 |
| 3,924,323 A | 12/1975 | Trevail et al. ................ 29/583 |
| 4,138,304 A | 2/1979 | Gantley ....................... 156/268 |
| 4,722,130 A | 2/1988 | Kimura et al. ................ 29/413 |
| 4,961,804 A | 10/1990 | Aurichio ...................... 156/248 |
| 5,456,404 A | 10/1995 | Robinette et al. ............ 228/104 |
| 5,534,102 A | 7/1996 | Kadono et al. ............... 156/250 |
| 6,040,204 A | * 3/2000 | Herden et al. ............... 438/109 |

FOREIGN PATENT DOCUMENTS

| | | |
|---|---|---|
| DE | 2431987 A1 | 1/1976 |
| DE | 3040675 A1 | 5/1982 |
| EP | 0800205 A1 | 10/1997 |
| JP | 618938 A | 1/1986 |
| JP | 5341000 A | 12/1993 |
| JP | 6151585 | 5/1994 |

\* cited by examiner

Primary Examiner—Vu A. Le
Assistant Examiner—Brad Smith
(74) Attorney, Agent, or Firm—Steven R. Biren

(57) ABSTRACT

A method of processing a substantially wafer-shaped product in semiconductor technology is described, which product is designed for the formation of a number of electronic circuit bodies over at least a first of its main surfaces, which circuit bodies are to be mechanically separated substantially perpendicularly to the first main surface, and which product has a second main surface lying opposite the first main surface. To arrange such a method in a manner which renders possible an inexpensive manufacture of semiconductor technology products in combination with as simple a product handling as possible also in the case of more stringent requirements, in particular caused by the ever greater miniaturization of conductor structures of electronic circuits formed on these products, it is proposed according to the invention that, for carrying out processing steps on one of the main surfaces of the product, a layer of adhesive material is provided in a planar manner on the opposite main surface of the product, on which layer a carrier element of at least substantially stable shape is provided so as to achieve a planar connection to said opposite main surface of the product.

17 Claims, 2 Drawing Sheets

METHOD OF PROCESSING A SINGLE SEMICONDUCTOR USING AT LEAST ONE CARRIER ELEMENT

BACKGROUND OF THE INVENTION

The invention relates to a method of processing a substantially wafer-shaped product in semiconductor technology, which product is designed for the formation of a number of electronic circuit bodies over at least a first of its main surfaces, which circuit bodies are to be mechanically separated substantially perpendicularly to the first main surface, and which product has a second main surface lying opposite the first main surface.

European patent application 0 800 205 discloses a method of separating electronic elements joined together in one body, wherein the side of the body facing away from the electronic elements is made thinner, the electronic elements are separated from one another, and electrical parameters of the electronic elements are tested after thinning of the body. Handling of the body is said to be improved in that before the thinning process an electrically non-conductive auxiliary layer is provided on the side of the body which comprises the electronic elements, in which auxiliary layer contact openings are formed above the electronic elements such that they each expose the contact(s) of the relevant electronic element. After the electrical parameters of the electronic elements have been tested, the electronic elements which are to be further used are selected and supplied to a device for further processing. The electronic elements still remain interconnected by means of bridges in the auxiliary layer until that moment. These bridges of the auxiliary layer are to be removed in said device, so that the electronic elements are also mechanically separated from one another. The auxiliary layer remains on the side of the body which comprises the electronic elements. The result of this is that the electronic elements will have a greater total constructional height than would be the case without said auxiliary layer, unless further measures are taken. In addition, the auxiliary layer requires additional, specialized processing steps, i.e. the manufacture of the contact openings and the bridges as well as severing of the latter. Moreover, it is necessary in this process to separate the body supporting the electronic elements in a direction starting from the side facing away from these elements for the purpose of separating the individual elements. This separation "from below", which is to be effected, for example, by etching, involves a considerable cost in particular for small structures of the electronic elements in order to safeguard a sufficiently accurate alignment for positioning the incisions. If a sawing process is used instead of etching, the additional disadvantage would arise that the surface of the body facing away from the sawing blade often tends to crumble during the sawing process, and that in this case the surface threatened by the crumbling process is the one which carries the electronic elements. This would increase the reject rate.

A method is known from the English abstract of publication JP 61-8938 (A) wherein a wafer with semiconductor elements is glued to a thermoelastic adhesive tape. The elements are separated from one another in that the tape is stretched out, are then electrically tested, and are removed from the tape. After the separation, however, the electrical measurements can only be carried out for individual elements, in particular in the case of very fine conductor structures on the semiconductor elements, since the exact geometric alignment of the elements in relation to one another is no longer guaranteed owing to the stretching of the tape. This means that multiple tests, i.e. simultaneous electrical measurements of a number of elements on a wafer, are no longer possible, or only with devices which require thorough and complicated alignment procedures.

A method is known from the English abstract of publication JP 5-341000 (A) wherein integrated circuits are individually taken up and subjected to an individual test after a wafer has been split up. Then the integrated circuits are laid on a new carrier in given positions and subjected thereon to a further, final test. Here a very expensive alignment step is to be carried out for arranging the integrated circuits on the further carrier, quite apart from the testing step which is individually carried out.

U.S. Pat. No. 5,456,404 furthermore discloses a similar process for testing semiconductor circuits. In this process, a special test housing is utilized in which the circuits are individually contacted and tested. It is to be achieved by means of a special construction of the contacts of the test housing that an increase in the pressure applied to the electronic circuit in the test housing fixes the circuit permanently in the housing in the case of a positive result of the electrical test, so that the test housing can be utilized also as a permanent housing for the integrated circuit. This, however, also requires a considerable cost and effort in the testing process and for the housing.

SUMMARY OF THE INVENTION

The invention has for its object to provide a method of the kind mentioned in the opening paragraph such that an inexpensive manufacture of semiconductor technology products can be combined with the simplest possible handling while at the same time complying with stricter requirements which are imposed in particular by the ever-increasing miniaturization of the conductor structures of the electronic circuit bodies formed on these products.

According to the invention, this object is achieved in a method as defined in the preamble of claim 1 in that, for carrying out processing steps on one of the main surfaces of the product, a layer of adhesive material is provided in a planar manner on the opposite main surface of the product, on which layer a carrier element of at least substantially stable shape is provided so as to achieve a planar connection to said opposite main surface of the product.

Such a semiconductor technology product within the scope of the teachings of the present invention is preferably a wafer of semiconductor material, for example of doped silicon. Alternatively, however, other materials may also be used, both elementary materials and compounds, metalloid or non-metallic. The word "wafer" is understood to mean an at least substantially cylindrical body with a small height in relation to its transverse dimensions hereinafter. The word "cylindrical" is understood to relate here to a body whose diameter measured perpendicularly to its longitudinal axis, its cylinder axis, has an at least substantially unchanged shape and dimension over its entire length along said cylinder axis. Whereas the diameter dimensions of the cylindrical body are measured perpendicularly to the cylinder axis, the height of the cylindrical body is measured parallel to the cylinder axis. The main surfaces of such a wafer are formed by the surfaces of the cylindrical body which face outwards in the direction of the cylinder axis. These main surfaces extend at least substantially parallel to one another in a wafer of the kind described. They then have a contour which corresponds at least substantially to a cross-sectional surface extending at right angles to the cylinder axis through the cylindrical body. Preferably, wafers with at least substantially circular main surfaces are used in semiconductor technology, wherein a number of electronic circuit bodies are formed on the first main surface, also called upper surface, while on the second main surface opposed to the first main surface a passivating or conductive layer is usually provided. This second main surface is then denoted the lower surface of the wafer.

The application of a semiconductor technology product as described on the carrier element in accordance with the invention renders it possible in a simple manner to subject said product to processing steps in manufacturing devices also if the product itself should not be suitable for the relevant processing steps and/or manufacturing devices on account of its dimensions or structures. This is true in particular for products with geometrically very small or mechanically highly vulnerable structures such as, for example, particularly thin wafers or electronic circuit bodies having structures in the sub-micron range. Such products are required, for example, for use in chip cards and should accordingly be suitable for production in very large numbers at a very low cost. It is of major economic importance in this case to have a possibility of treating such products with simple and inexpensive standard processes both in manufacture and in electrical testing. This is rendered possible by the present invention in that the product provided on the carrier element can be processed in all manufacturing steps as a single, i.e. non-separated, mechanically stable wafer, as will be explained in more detail below.

Depending on which of the main surfaces of the product is to be processed, the adhesive material and the carrier element may be provided on the relevant other main surface of the product so as to achieve a planar connection. The invention indeed renders it possible to provide a carrier element both on the upper surface of the product and on its lower surface, simultaneously or consecutively, as desired, without impairing the properties of the product, in particular without impairing the mechanical and/or electrical parameters of electronic circuit bodies formed on the upper surface. Preferably, a carrier element is provided on the first main surface, i.e. the upper surface of the product by means of adhesive material in-order to subject the product over its second main surface, i.e. its lower surface, to a processing step, preferably for a planar removal of material. Such a removal of material may advantageously be effected through grinding, lapping or etching and serves to thin the product, i.e. the wafer, down to the final substrate thickness of the electronic circuit bodies formed on the product. Processing steps subsequent to this thinning process are preferably carried out with a carrier element provided on the upper surface, since the mechanical stability of the product is improved thereby, i.e. its fragility is reduced. Preferably, devices suitable also for products of greater thickness and capable of a simple and inexpensive processing may be used for the thinning process and the subsequent process steps, because a high fragility of the product need not be taken into account.

In a further embodiment of the method according to the invention, the product is subjected to a process step for the mechanical separation of the electronic circuit bodies over its first main surface (upper surface) after the adhesive material and the carrier element have been provided on the second main surface, i.e. on the lower surface. This separation is preferably carried out by sawing. The provision of a mask and a subsequent etching of separating lanes, for example, is also possible.

In another embodiment of the method according to the invention, the product is subjected to an electrical test of the electronic circuit bodies after the adhesive material and the carrier element have been provided on the second main surface (lower surface). Preferably, the electrical test is carried out after the process step for mechanical separation in the same way as for a non-separated product.

A particular advantage of the method according to the invention becomes apparent in this embodiment. There is a possibility during mechanical separation, in particular by sawing, that individual electronic circuit bodies are damaged to such an extent that they are no longer functional, which renders it necessary to carry out the step of electrical testing, at least the final electrical test, after the completion of all processing steps in the manufacture of the electronic circuit bodies if the resulting number of reject products is to be correctly determined. On the other hand, an essential advantage for the electrical testing step is provided by a wafer-type product before its separation into individual electronic circuit bodies, i.e. that all electronic circuit bodies are geometrically accurately positioned relative to one another. Very narrow tolerances are to be observed especially for electronic circuit bodies with very small structures in order to bring electrical contacting devices of a unit for carrying out electrical tests correctly into contact with contact points on the electronic circuit bodies. These tolerances can be observed in an individual implementation of an electrical testing step if an alignment is carried out between each individual electronic circuit body and the electrical contacting device of the unit for carrying out the electrical tests. This, however, leads to a very time-consuming and accordingly expensive electrical testing process for the electronic circuit bodies. Simultaneous tests of a plurality of electronic circuit bodies on a wafer are accordingly preferred, for which purpose the electrical contacting devices of the unit for carrying out the electrical tests must contact several electronic circuit bodies simultaneously. Narrow dimensional tolerances are to be observed if the alignment expenditure for this is to be kept small, both in the arrangement of the electrical contacting devices of the unit for carrying out the electrical tests and in the geometric arrangement of the contact points on the electronic circuit bodies. These tolerances can only be effectively achieved if during the electrical testing steps the electronic circuit bodies occupy accurately defined positions relative to one another. These positions are preferably the same as those on the non-separated product, for example, the non-sawed wafer.

The conflict constituted by these mutually opposed requirements is resolved in a very simple and inexpensive manner by the invention. The connection achieved between the product and the carrier element achieves that the electronic circuit bodies retain their exactly defined geometric positions also after mechanical separation. As a result, the step of electrical testing can be carried out with the same simplifications after the mechanical separation step, i.e. on the fully completed product, in the same way as it is possible for a non-separated product (non-sawed wafer), while the handling or mechanical production manipulation of the products is not subject to stringent requirements thanks to the mechanical stability offered by the carrier element, and can accordingly be carried out in an inexpensive manner. In particular, devices may be utilized for this which are also used for the treatment of non-separated products of higher mechanical stability.

The invention offers not only the possibility of subjecting a plurality of electronic circuit bodies simultaneously to the electrical testing process, but also the possibility, if so desired, of carrying out the electrical testing steps consecutively on one product for all electronic circuit bodies.

Alignment is then also simplified by the invention, since it is only necessary to carry out an exact alignment between the electronic circuit body which is to be tested first on a wafer and the electrical contacting devices of the unit for carrying out the electrical tests. These electrical contacting devices may then be shifted over defined distances for testing the other electronic circuit bodies of the wafer without further alignments. This advantage of the carrying out of electrical tests of a non-separated product can again be transferred to a product with electronic circuit bodies mechanically separated from one another thanks to the application of the method according to the invention.

It is obvious that these advantages require a carrier element which is at least substantially stable in shape. The required stability of shape must be such that mechanical forces acting on the carrier element during the process steps cannot lead to deformation of the carrier element which could jeopardize the observance of the tolerances as described above or could lead to damage of the product. This requirement clearly distinguishes the carrier elements used according to the invention from the stretchable foils used in the separation of the electronic circuit bodies according to the prior art.

It is quite possible, however, to use a carrier element according to the invention which allows itself to be deformed slightly by the application of mechanical forces which do not occur during the product processing steps described above, i.e. which are sufficiently great, such that a separation of the product from the carrier element yet to be described below is rendered easier thereby.

Such a separation is preferably carried out in that, in an alternative embodiment of the method according to the invention, the adhesive force of the adhesive material can be degraded through the application of heat energy and/or irradiation. Preferably, the adhesive material may be sensitive to ultraviolet (UV) radiation, so that the adhesive force can be degraded by UV irradiation. This embodiment also simplifies the processing of the product described, because the irradiation with UV is a common technique in semiconductor technology and accordingly requires no special equipment for carrying out this process step in accordance with said further embodiment of the invention. The same advantage indeed applies to the use of heat-sensitive adhesive materials.

Useful heat-sensitive adhesive materials are particularly those whose adhesive force is reduced when certain temperature limits are exceeded, which reduction is preferably irreversible, so that the adhesive force remains reduced after cooling-down of the adhesive materials. It is furthermore advantageous when adhesive materials whose respective adhesive forces are reduced upon exceeding different temperature limits are used for providing the carrier elements on the distinct main surfaces of a product of the kind described. This means that, when two such materials are used simultaneously, a controlled temperature rise is capable of reducing the adhesive force of the material having the lower temperature limit, whereas the adhesive force of the other material is not yet reduced as long as the instantaneous temperature has not yet exceeded the temperature limit thereof.

Such a choice of the adhesive materials may preferably be made for the case in which a carrier element is provided on each of the two main surfaces of the product by means of adhesive material in at least one processing step, and in which one of these carrier elements is to be removed without detracting from the adhesion of the product to the other carrier element. The adhesive material by means of which the carrier element has been provided which is to be removed first in the course of further processing will then have the lower temperature limit. Only this one carrier element can then be detached in a controlled manner through the application of heat, while the other one remains on the product. Such a case will arise in particular in the change from processing of one of the main surfaces to processing of the other main surface.

The adhesive material may be provided in various operational forms, for example as a liquid. Preferably, however, it is provided in the form of a foil which is coated with an adhesive agent of both sides. Such a double-sided adhesive foil can be readily laminated onto one of the main surfaces of the product. Such a foil may also serve as a protective foil if it is adhesive at one side only.

As discussed above, carrier elements can be provided on both main surfaces of the product in the method according to the invention. This may take place simultaneously or, preferably, consecutively, i.e. first on the one and then on the other main surface. This considerably simplifies the overall processing of the product. In a preferred embodiment of the invention, a processing method may comprise the following process steps which are carried out consecutively in time:

a) planar application of a first layer of adhesive material on the first main surface of the product, b) provision of a first carrier element onto the first layer of adhesive material, whereby a planar connection is formed between the first main surface of the product and the first carrier element, c) mechanical and/or chemical, preferably planar material removal from the second main surface of the product, d) planar application of a second layer of adhesive material on the second main surface of the product, e) provision of a second carrier element onto the second layer of adhesive material, whereby a planar connection is formed between the second main surface of the product and the second carrier element, f) reduction of the adhesive force of the first layer of adhesive material through the application of heat energy and/or irradiation, g) removal of the first layer of adhesive material and of the first carrier element from the first main surface, h) mechanical separation of the electronic circuit bodies formed on the first main surface, preferably through sawing of the product, i) electrical testing of the functions of the mechanically separated electronic circuit bodies which are still fixed in their unchanged spatial positions on the second carrier element as compared with the non-sawed product, and identification of non-functional electronic circuit bodies, j) reduction of the adhesive force of the second layer of adhesive material through the application of heat energy and/or irradiation, i.e. if the adhesive force of both adhesive materials is reduced through the application of heat energy, a lower temperature limit is to be exceeded for the second adhesive material for reducing the adhesive force as compared with the first adhesive material, k) removal of the individual electronic circuit bodies from the second carrier element.

Such a manufacturing process utilizes the method according to the invention twice in a particularly advantageous manner. Operations on the lower side of the product are possible here without the risk of fractures in a simple and inexpensive manner. The electronic testing of functions requires no change in comparison with traditional functional tests of a product before the mechanical separation of the electronic circuit bodies. Handling of the product takes place as in the non-separated state in all process steps. The electrical functional test may be carried out after separation as the final process step before packaging and/or dispatch.

An increase in the number of process steps carried out is also possible in a very simple manner. Carrier elements may be provided consecutively on the upper side and on the lower side of the product for the individual process steps in alternation, if so desired. The upper side and the lower side of the product can then be treated several times consecutively in alternation with the advantages described above.

BRIEF DESCRIPTION OF THE DRAWING

An embodiment of a process in accordance with the invention is shown in the drawing and described in more detail below. In the Figures.

DESCRIPTION OF THE PREFERRED EMBODIMENTS

Figure 1:
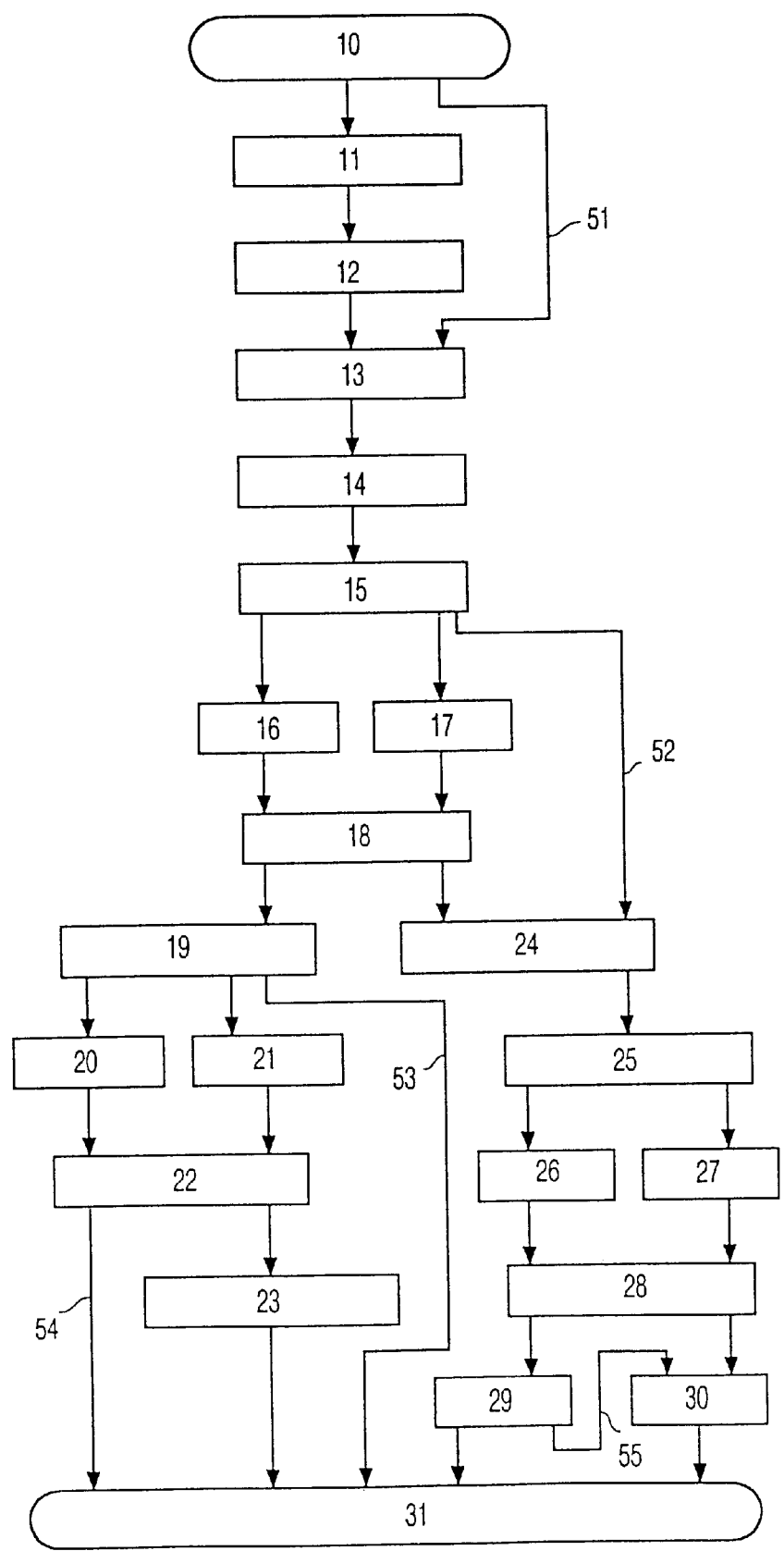
FIG. 1 is a block diagram showing an example of a processing sequence.
Figure 2A:
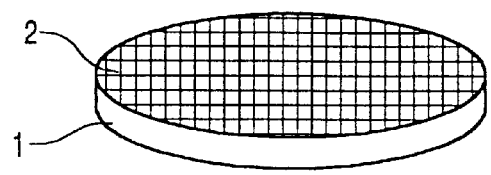
FIG. 2A is a wafer-shaped semiconductor product with a number of electronic circuit bodies formed on its upper surface.

The block diagram shown in FIG. 1 represents part of a manufacturing process of a semiconductor technology product. The starting point of the method shown by way of example is an at least substantially wafer-shaped semiconductor product on whose first main surface (upper surface) a number of electronic circuit bodies have been formed. A diagrammatic picture of such a product is shown in FIG. 2a. Reference numeral 1 therein represents the product, for example a wafer of semiconductor material. The first main surface (upper side) has reference numeral 2. A pattern of mutually perpendicular lines on the upper side 2 of the product 1 diagrammatically represents the individual electronic circuit bodies formed thereon. These circuit bodies were formed in a manner known per se, for example through diffusion and the like. FIG. 2a shows the product in the situation immediately after these process steps have been completed, i.e. steps which do not form part of the present invention and which are accordingly not described in any detail here. This starting point is denoted by the block having reference numeral 10 in the diagram of FIG. 1.

The product is now subjected to a known planar material-removing, i.e. thinning process at its second main surface (lower side) in a process step referenced 13, for example through grinding, lapping, or etching. The sequence comprising this step subsequent to the starting position 10 is indicated with an arrow 51.

Figure 2B:
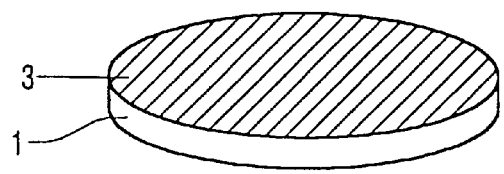
FIG. 2B is a wafer-shaped semiconductor product as in laminated with a double-sided adhesive foil.
Figure 2C:
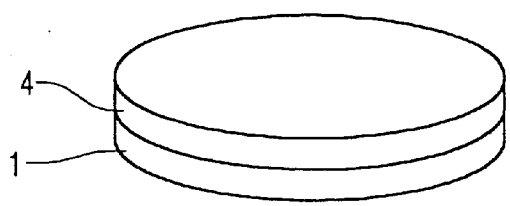
FIG. 2C is a wafer-shaped semiconductor product with a carrier element.
Figure 2D:
FIG. 2D is a wafer-shaped semiconductor with a carrier element subject to a thinning process.

According to the invention, this sequence is modified such that in a first step after the starting point 10 a double-sided adhesive foil is laminated onto the upper side 2 of the product 1 in a process step 11, which foil has reference numeral 3 in FIG. 2b. This double-sided adhesive foil 3 forms an adhesive material on which a first carrier element is provided in process step 12 which follows process step 11. This first carrier element has reference numeral 4 in FIG. 2c. According to the invention, the thinning process in step 13 of FIG. 1 is now carried out on the product 1 provided on the first carrier element 4 in process step 13. The result of this process step is diagrammatically shown in FIG. 2d.

Figure 2E:
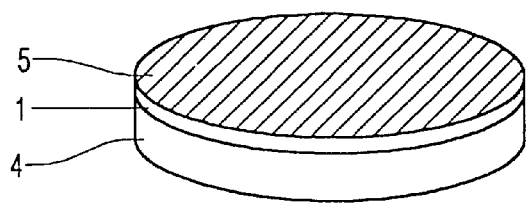
FIG. 2E is a wafer-shaped semiconductor product laminated with a second double-sided adhesive foil.
Figure 2F:
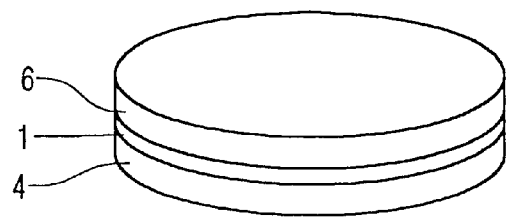
FIG. 2F is a wafer-shaped semiconductor product with a second carrier element.

After the product 1 has been made thinner at its lower side, the next process step 14 comprises the lamination of a second adhesive material, for example again in the form of a two-sided adhesive foil, onto the second main surface (lower surface) of the product 1. This second two-sided adhesive foil has reference numeral 5 in FIG. 2e. Then a carrier element, denoted second carrier element and having reference numeral 6 in FIG. 2f, is provided on the two-sided adhesive foil 5 in a process step 15. As FIG. 2f diagrammatically shows, the element is connected on both sides to respective carrier elements 4 and 6 after the process step 15 has been completed.

Since the next process on the product 1 is to take place at its upper side 2, it is necessary first to remove the first carrier element 2 and then also the first adhesive material 3 from this upper side 2. For this purpose the first adhesive material, i.e. the adhesive agent provided on the two-sided adhesive foil 3 in the present example, will be sensitive to ultraviolet radiation such that its adhesive force can be reduced through UV irradiation. Such an UV irradiation is carried out in the process step referenced 16. The first carrier element 4 should be permeable to UV radiation for this purpose. This UV radiation is symbolized with arrows 7 in FIG. 2f.

Alternatively, the adhesive force of a first adhesive material of a suitable type may be reduced through the supply of heat energy in a process step 17 which takes the place of process step 16. For this purpose an adhesive agent with a temperature limit lower than the temperature limit of the second adhesive material 5 is to be selected for the first adhesive material, i.e. for example the first two-sided adhesive foil 3. It is also possible for the adhesive materials used to distinguish themselves from each other in that one is treated with UV irradiation and the other with a temperature rise, i.e. the supply of heat energy, for the purpose of reducing the adhesive force, and that they are of suitable types for this.

The same result is achieved by both embodiments of the method described by way of example, however, i.e. the result that the first carrier element 4 can be removed jointly with the first adhesive material 3, i.e. the double adhesive foil 3 whose adhesive force has been reduced, from the upper side 2 of the product 1. This is done in process step 18. The product 1 is then still connected to the second carrier element 6 by its lower side. The upper side is exposed for further process steps. This situation is diagrammatically shown in FIG. 2g.

Figure 2G:
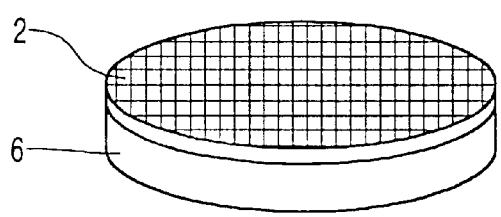
FIG. 2G is a wafer-shaped semiconductor product with an exposed upper side.

In a first modification of the method shown in FIG. 1, comprising the process steps referenced 19 to 23 and the modified sequences of the above process steps indicated with arrows 53 and 54, the product is subjected to a test of electrical functions in the situation shown in FIG. 2g, symbolized in FIG. 1 by the process step in block 19. Subsequently, the second main surface, i.e. the lower side of the product 1 is irradiated with UV in a process step 20 so as to neutralize the adhesive force of the two-sided adhesive foil 5 on the lower side. This process step corresponds to process step 16 except that the latter is applied to the other main surface of the product 1. In a modification, the second adhesive material (two-sided adhesive foil) 5 on the lower side of the product 1 may instead be treated through the application of heat energy for reducing the adhesive force in a process step 21 which may alternatively be carried out. Both the process step 20 and the alternative process step 21 are followed by the removal of the second carrier element 6 and of the second adhesive material 5 from the lower side of the product 1 in process step 22. After this process step 22 has been carried out, the product 1 is available in the finished state, for example as a wafer of semiconductor material, except for the mechanical separation of the electronic circuit bodies formed thereon. In the possible embodiment symbolized by arrow 54, the product 1 may now be directly delivered, symbolized by block 31 in FIG. 1, or alternatively the electronic circuit bodies formed on the product 1 may be separated in a process step 23 before delivery, for example through sawing of the wafer, as desired.

In a second modification, the delivery of the product 1 may also take place immediately after the test 19 of electrical functions has been carried out, as indicated with arrow 53 in FIG. 1. The product 1 is then still present on the second carrier element 6, and the electronic circuit bodies have not yet been mechanically separated.

A preferred embodiment, however, is subjected to the method according to the invention in a modification symbolized by steps 24 to 30 in FIG. 1. In this embodiment, the removal of the first adhesive material 3 and of the first carrier element 4 from the upper side 2 of the product 1 in process step 18 is followed by a process step 24 in which the electronic circuit bodies formed on the upper side 2 of the product I are mechanically separated, for example through sawing of the wafer made of semiconductor material. In contrast to process step 23, however, this mechanical separation takes place in a stage of the method in which the product 1 is still connected to the second carrier element 6. As a result, the individual electronic circuit bodies remain undisturbed in their geometric positions relative to one another on the second carrier element 6 after separation. Accordingly, the same process steps and devices can basically be used in the subsequent process step 25, in which a test of the electrical functions of the electronic circuit bodies is carried out, as in the process step 19 described above. The advantage here is, however, that the mechanical processing of the electronic circuit bodies has been fully completed and that the test 25 of electrical functions will also detect manufacturing defects and rejects which have only arisen as a result of the mechanical separation, in particular through chipping-off during sawing of a wafer of semiconductor material. In particular products consisting of very thin wafers of semiconductor material can now be treated, i.e. at least tested and separated, by means of conventional processing devices for semiconductor products in this manner. This renders the processing of the very fragile products much easier. Incorrect circuit bodies are identified with color marks in a usual manner in the test 25 of electrical functions, or their positions within the overall product 1 are laid down in a test protocol or something similar on which a subsequent sorting process of the electronic circuits may be based (a so-called wafer map).

The process steps 26 and 27 which optionally follow the process step 25 comprising the test of electrical functions again comprise the neutralization of the adhesive force of the second adhesive material (two-sided adhesive foil) 5 between the lower side of the product 1 and the second carrier element 6. Step 26 will be carried out in the same way as step 20 described above, i.e. through UV irradiation of the lower side of the product 1. Step 27 is similar to step 21 and comprises the supply of heat energy to the second adhesive material (two-sided adhesive foil) 5 for neutralizing the adhesive force of this material.

The same result will be obtained in steps 26 and 27, whichever one was chosen, i.e. that the mechanically separated electronic circuit bodies of the product 1 are now available for removal from the second carrier element 6. This removal is carried out in process step 28. This is preferably done in that the circuit bodies recognized as free from defects are collected in process step 25 by means of a vacuum pipette. The individual circuit bodies may then be packed for delivery in a process step 29, so that they become available in a usual tablet, tape, or roll packaging. If so desired, the electronic circuit bodies may also be immediately mounted, for example in a housing, in a process step 30 so as to be supplied in this state 31. Finally, arrow 55 indicates a further modification in which the electronic circuit bodies after being packed 29 are supplied on suitable carriers first to a mounting device and then, after mounting 30, are made ready for delivery. Further modifications are possible.

A further modification in the sequence of process steps as described is indicated with arrow 52 in FIG. 1. If a carrier element was not provided on the upper side 2 of the product 1 in the modification indicated by arrow 51, the process steps 16 to 18 will be omitted. Preferably, process step 24 is then carried out immediately after the carrier element 6 has been provided on the lower side of the element 1, i.e. the electronic circuit bodies are then mechanically separated.

The carrier elements must be stable in shape, as described above, so that the dimensional tolerances can be complied with in the alignment especially of the contact points of the electronic circuit bodies with respect to the electrical contacting devices of the devices for carrying out the electrical tests. A rigid carrier element complies best with this requirement. By contrast, a flexible carrier element will be easier to detach from the product 1, both in the non-separated state and during collecting of the mechanically separated electronic circuit bodies, especially if the adhesive force of the second adhesive material was not completely neutralized. The carrier elements used in the invention must constitute a compromise between these two requirements, i.e. they must comply with these requirements to the same degree. Accordingly, the carrier elements are preferably constructed so as to be of stable shape, but slightly flexible.

Methods and devices are known for the mechanical separation of the electronic circuit bodies on the product 1 wherein the product is clamped on a standardized frame. These frames, also known as "Film Frame Carriers" (FFC) comprise a foil on which the wafer to be processed in a conventional manner is clamped. These FFCs may also be used unchanged for securing the assembly according to the invention comprising the product 1 and (preferably) the carrier element 6 on the lower side of the product 1. Similarly, however, the carrier element 6 may be so designed that it itself forms an FFC.

In a practical embodiment of the method according to the invention, a wafer of semiconductor material is laminated on its upper side 2 with a UV double foil from the manufacturer Furukawa as the first adhesive material 3. Then a polycarbonate disc of 0.5 mm thickness and of a transparent material is provided as the first carrier element 4. The second adhesive material 5 is formed by a temperature-sensitive double foil from the manufacturer Nitto, and the second carrier element 6 on the lower side of the product 1 is formed by a glass disc of 0.5 mm thickness. UV irradiation and the supply of heat energy are provided by conventional UV irradiation devices and heater plates.

What is claimed is:

1. A method of processing a single substantially wafer-shaped semiconductor comprising a number of mechanically separated electronic circuit bodies distributed over at least one main surface of the semiconductor substantially perpendicular to the at least one main surface, and which semiconductor has a second main surface lying opposite the first main surface, the method comprising:

providing a single substantially wafer-shaped semiconductor, depositing a layer of adhesive material in a planar manner on the second main surface of the semiconductor, affixing a carrier element of at least substantially stable shape to the layer of adhesive material so as to achieve a planar connection to said second main surface of the semiconductor, and simultaneously electrically testing the electronic circuit bodies.

2. A method as claimed in claim 1, wherein the adhesive material and the carrier element form a planar connection to the first main surface of the semiconductor.

3. A method as claimed in claim 1, wherein the adhesive material and the carrier element form a planar connection to the second main surface of the semiconductor.

4. A method as claimed in claim 2, wherein the method further comprises planar removing of the adhesive material from the second main surface of the semiconductor after the adhesive material and the carrier element have been provided on the first main surface.

5. A method as claimed in claim 3, wherein the method further comprises mechanically separating the electronic circuit bodies over the first main surface of the semiconductor after the adhesive material and the carrier element have been provided on the second main surface.

6. A method as claimed in claim 3, wherein the method further comprises electrically testing the electronic circuit bodies after the adhesive material and the carrier element have been provided on the second main surface.

7. A method as claimed in claim 6, wherein the electrically testing step is carried out after the mechanically separating step in the same manner as for a non-separated semiconductor.

8. A method as claimed in claim 1, wherein the adhesive force of the adhesive material can be degraded through the application of heat energy and/or irradiation.

9. A method as claimed in claim 8, wherein the adhesive force can be reduced through irradiation with ultraviolet light.

10. A method as claimed in claim 8, wherein adhesive materials whose adhesive forces are reduced when given temperature limits are exceeded, while adhesive materials having different temperature limits are used for providing the carrier elements on the different main surfaces of the semiconductor technology semiconductor.

11. A method as claimed in claim 10, characterized in that a carrier element is provided on both main surfaces of the semiconductor by means of adhesive material during at least one process step, and in that the adhesive material by means of which the carrier element to be removed first in the course of the subsequent process has been provided has the lower temperature limit.

12. A method as claimed in claim 1, characterized in that a foil coated on both sides with an adhesive agent is used as the adhesive material.

13. A method as claimed in claim 1, characterized in that the process steps are carried out in a time sequence as defined below:

a) planar application of a first layer of adhesive material on the first main surface of the semiconductor, b) provision of a first carrier element onto the first layer of adhesive material, whereby a planar connection is formed between the first main surface of the semiconductor and the first carrier element, c) mechanical and/or chemical, planar material removal from the second main surface o the semiconductor, d) planar application of a second layer of adhesive material on the second main surface of the semiconductor, e) provision of a second carrier element onto the second layer of adhesive material, whereby a planar connection is formed between the second main surface of the semiconductor and the second carrier element, f) reduction of the adhesive force of the first layer of adhesive material through the application of heat energy and/or irradiation, g) removal of the first layer of adhesive material and of the first carrier element from the first main surface, h) mechanical separation of the electronic circuit bodies formed on the first main surface semiconductor, i) electrical testing of the functions of the mechanically separated electronic circuit bodies which are still fixed in their unchanged spatial positions on the second carrier element as compared with the non-sawed semiconductor, and identification of non-functional electronic circuit bodies, j) reduction of the adhesive force of the second layer of adhesive material through the application of heat energy and/or irradiation, i.e. if the adhesive force of both adhesive materials is reduced through the application of heat energy, a lower temperature limit is to be exceeded for the second adhesive material for reducing the adhesive force as compared with the first adhesive material, k) removal of the individual electronic circuit bodies from the second carrier element.

14. A single semiconductor generated using a method of processing a single substantially wafer-shaped semiconductor comprising a number of mechanically separated electronic circuit bodies distributed over at least one main surface of the semiconductor substantially perpendicular to the at least one main surface, and which semiconductor has a second main surface lying opposite the first main surface, the method comprising:

depositing a layer of adhesive material in a planar manner on the second main surface of the semiconductor, and affixing a carrier element of at least substantially stable shape to the layer of adhesive material so as to achieve a planar connection to said second main surface of the semiconductor.

15. A method of processing a single substantially wafer-shaped semiconductor comprising a number of mechanically separated electronic circuit bodies distributed over at least one main surface of the semiconductor substantially perpendicular to the at least one main surface, and which semiconductor has a second main surface lying opposite the first main surface, the method comprising:

depositing a layer of adhesive material in a planar manner on the second main surface of the semiconductor, affixing a carrier element of at least substantially stable shape to the layer of adhesive material so as to achieve a planar connection to said second main surface of the semiconductor, mechanically and/or chemically removing planar material from the second main surface of the semiconductor, depositing a second layer of adhesive material on the second main surface of the semiconductor, affixing a second carrier element onto the second layer of adhesive material, whereby a planar connection is formed between the second main surface of the semiconductor and the second carrier element, reducing the adhesive force of the first layer of adhesive material through the application of heat energy and/or irradiation, and removing the first layer of adhesive material and of the first carrier element from the first main surface.

16. The method of claim 15, further comprising mechanically separating the electronic circuit bodies formed on the first main surface.

17. The method of claim 16, further comprising electrical testing of the functions of the mechanically separated electronic circuit bodies which are still fixed in their unchanged spatial positions on the second carrier element as compared with the non-sawed semiconductor, and identification of non-functional electronic circuit bodies.

* * * * *